United States Patent
Rice et al.

(10) Patent No.: US 7,221,993 B2
(45) Date of Patent: May 22, 2007

(54) SYSTEMS AND METHODS FOR TRANSFERRING SMALL LOT SIZE SUBSTRATE CARRIERS BETWEEN PROCESSING TOOLS

(75) Inventors: Michael R. Rice, Pleasanton, CA (US); Eric A. Englhardt, Palo Alto, CA (US); Vinay Shah, San Francisco, CA (US); Martin R. Elliott, Round Rock, TX (US); Robert B. Lowrance, Los Gatos, CA (US); Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/764,620

(22) Filed: Jan. 26, 2004

(65) Prior Publication Data

US 2004/0193300 A1    Sep. 30, 2004

Related U.S. Application Data

(60) Provisional application No. 60/443,001, filed on Jan. 27, 2003.

(51) Int. Cl.
    *G06F 19/00* (2006.01)
(52) U.S. Cl. .................. 700/112; 700/101; 700/108; 700/111; 700/121
(58) Field of Classification Search .............. 700/121, 700/108, 109, 110, 95, 99, 112, 113, 101, 700/100, 213, 214, 217, 228, 111
    See application file for complete search history.

(56) References Cited

U.S. PATENT DOCUMENTS 3,845,286 A    10/1974    Aronstein et al.
3,952,388 A    4/1976    Hasegawa et al.
4,027,246 A    5/1977    Caccoma et al.
4,166,527 A    9/1979    Beezer (Continued)

FOREIGN PATENT DOCUMENTS

DE    19715974 A1    10/1998

(Continued)

OTHER PUBLICATIONS

Lovell, A. M. et al., "Cell automation: integrating manufacturing with robotics", Dec. 1990, Solid State Technology, vol. 33 No. 12, p. 37-9.

(Continued)

*Primary Examiner*—Leo Picard
*Assistant Examiner*—Charles Kasenge
(74) *Attorney, Agent, or Firm*—Dugan & Dugan

(57) ABSTRACT

In a first aspect, a method of managing work in progress within a small lot size semiconductor device manufacturing facility is provided. The first method includes providing a small lot size semiconductor device manufacturing facility having (1) a plurality of processing tools; and (2) a high speed transport system adapted to transport small lot size substrate carriers among the processing tools. The method further includes maintaining a predetermined work in progress level within the small lot size semiconductor device manufacturing facility by (1) increasing an average cycle time of low priority substrates within the small lot size semiconductor device manufacturing facility; and (2) decreasing an average cycle time of high priority substrates within the small lot size semiconductor device manufacturing facility so as to approximately maintain the predetermined work in progress level within the small lot size semiconductor device manufacturing facility. Numerous other aspects are provided.

23 Claims, 2 Drawing Sheets

U.S. PATENT DOCUMENTS

| | | |
|---|---|---|
| 4,401,522 A | 8/1983 | Buschow et al. |
| 4,534,843 A | 8/1985 | Johnson et al. |
| 4,540,088 A | 9/1985 | Bergh |
| 4,650,264 A | 3/1987 | Dahnert |
| 4,775,046 A | 10/1988 | Gramarossa et al. |
| 5,048,164 A | 9/1991 | Harima |
| 5,110,249 A | 5/1992 | Norman |
| 5,183,378 A | 2/1993 | Asano et al. |
| 5,256,204 A | 10/1993 | Wu |
| 5,261,935 A | 11/1993 | Ishii et al. |
| 5,372,471 A | 12/1994 | Wu |
| 5,382,127 A | 1/1995 | Garric et al. |
| 5,388,945 A | 2/1995 | Garric et al. |
| 5,390,785 A | 2/1995 | Garric et al. |
| 5,411,358 A | 5/1995 | Garric et al. |
| 5,544,350 A | 8/1996 | Hung et al. |
| 5,603,777 A | 2/1997 | Ohashi |
| 5,612,886 A | 3/1997 | Weng |
| 5,668,056 A | 9/1997 | Wu et al. |
| 5,696,689 A | 12/1997 | Okumura et al. |
| 5,762,544 A | 6/1998 | Zuniga et al. ............. 451/285 |
| 5,811,211 A | 9/1998 | Tanaka et al. |
| 5,818,716 A | 10/1998 | Chin et al. |
| 5,825,650 A | 10/1998 | Wang |
| 5,827,118 A | 10/1998 | Johnson et al. |
| 5,829,939 A | 11/1998 | Iwai et al. |
| 5,884,392 A | 3/1999 | Lafond |
| 5,888,042 A | 3/1999 | Oda |
| 5,971,585 A | 10/1999 | Dangat et al. |
| 5,976,199 A | 11/1999 | Wu et al. |
| 5,980,183 A | 11/1999 | Fosnight |
| 6,026,561 A | 2/2000 | Lafond |
| 6,036,426 A | 3/2000 | Hillman |
| 6,048,259 A | 4/2000 | Asai |
| 6,050,768 A | 4/2000 | Iwasaki et al. |
| 6,053,688 A | 4/2000 | Cheng |
| 6,054,181 A | 4/2000 | Nanbu et al. |
| 6,082,948 A | 7/2000 | Fishkin et al. |
| 6,128,588 A | 10/2000 | Chacon |
| 6,183,186 B1 | 2/2001 | Peltola et al. |
| 6,196,001 B1 | 3/2001 | Tannous et al. |
| 6,235,634 B1 | 5/2001 | Law et al. |
| 6,240,335 B1 | 5/2001 | Wehrung et al. |
| 6,283,692 B1 | 9/2001 | Perlov et al. |
| 6,415,260 B1 | 7/2002 | Yang et al. |
| 6,431,814 B1 * | 8/2002 | Christensen et al. .......... 702/81 |
| 6,439,822 B1 | 8/2002 | Kimura et al. |
| 6,564,113 B1 * | 5/2003 | Barto et al. ................... 700/99 |
| 6,579,052 B1 | 6/2003 | Bonora et al. |
| 6,587,744 B1 | 7/2003 | Stoddard et al. |
| 6,662,076 B1 * | 12/2003 | Conboy et al. ............. 700/121 |
| 6,673,638 B1 | 1/2004 | Bendik et al. |
| 6,684,124 B2 | 1/2004 | Schedel et al. |
| 6,763,277 B1 * | 7/2004 | Allen et al. ................. 700/100 |
| 6,788,985 B2 * | 9/2004 | Mitsutake et al. ............ 700/95 |
| 6,839,603 B2 | 1/2005 | Karasawa |
| 2002/0090282 A1 | 7/2002 | Bachrach |
| 2002/0094588 A1 | 7/2002 | Fan et al. |
| 2002/0114684 A1 | 8/2002 | Jeong et al. |
| 2002/0116086 A1 | 8/2002 | Huber et al. |
| 2002/0144654 A1 | 10/2002 | Elger et al. |
| 2003/0010449 A1 | 1/2003 | Gramarossa et al. |
| 2003/0108407 A1 | 6/2003 | Ogata et al. |
| 2003/0202866 A1 | 10/2003 | Weng et al. |
| 2004/0049398 A1 | 3/2004 | Gartland et al. |
| 2004/0062633 A1 | 4/2004 | Rice et al. |
| 2004/0187342 A1 | 9/2004 | Izuta |
| 2005/0096775 A1 | 5/2005 | Wang et al. |

FOREIGN PATENT DOCUMENTS

| | | |
|---|---|---|
| EP | 0 277 536 A | 8/1988 |
| EP | 0 365 589 B1 | 9/1992 |
| EP | 0 582 019 A1 | 2/1994 |
| EP | 0 663 686 A1 | 7/1995 |
| EP | 0 850 720 A1 | 7/1998 |
| EP | 0 987 750 A1 | 3/2000 |
| EP | 1128246 A2 | 8/2001 |
| EP | 1 134 641 A1 | 9/2001 |
| JP | 55091839 A | 7/1980 |
| JP | 58028860 A | 2/1983 |
| JP | 60049623 A | 3/1985 |
| JP | 63234511 | 9/1988 |
| JP | 01181156 A | 7/1989 |
| JP | 01257549 A | 10/1989 |
| JP | 02015647 A | 1/1990 |
| JP | 05128131 A | 5/1993 |
| JP | 05290053 A | 11/1993 |
| JP | 06132696 | 5/1994 |
| JP | 06260545 A | 9/1994 |
| JP | 08249044 A | 9/1996 |
| JP | 09115817 A | 5/1997 |
| JP | 10135096 A | 5/1998 |
| JP | 10-256346 | 9/1998 |
| JP | 11176717 A | 7/1999 |
| JP | 11296208 A | 10/1999 |
| JP | 2000012646 A2 | 1/2000 |
| JP | 2001332464 A | 11/2001 |
| JP | 2003007584 A | 1/2003 |
| WO | WO 99/28952 A2 | 6/1999 |
| WO | WO 99/64207 | 12/1999 |
| WO | WO 02/19392 A1 | 3/2002 |
| WO | WO 2005/006408 A1 | 1/2005 |

OTHER PUBLICATIONS

Prasad, K., "A generic computer simulation model to characterize photolithography manufacturing area in an IC FAB facility", Sep. 1991, IEEE Transactions on Components, Hybrids, and Manufacturing Technology, vol. 14 No. 3, p. 483-7.

Ehteshami, B. et al., "Trade-offs in cycle time management: hot lots", May 1992, IEEE Transactions on Semiconductor Manufacturing, vol. 5 No. 2, p. 101-6.

Lou, S. et al., "Using simulation to test the robustness of various existing production control policies", 1991, 1991 Winter Simulation Conference Proceedings, IEEE, p. 261-9.

Berg, R. et al., " The formula: world class manufacturing for hybrid thin-film component production", 1992, IEEE/SEMI International Semiconductor Manufacturing Science Symposium, pp. 53-60.

Naguib, H., "The implementation of total quality management in a semiconductor manufacturing operation", 1992, IEEE/SEMI International Semiconductor Manufacturing Science Symposium, p. 63-7.

Rose, D., " Productivity enhancement", 1992, IEEE/SEMI International Semiconductor Manufacturing Science Symposium, p. 68.

Narayanan, S. et al., "Object-oriented simulation to support operator decision making in semiconductor manufacturing", 1992, 1992 IEEE International Conference on Systems, Man and Cybernetics, vol. 2, p. 1510-15.

Leonovich, G. A. et al., "Integrated cost and productivity learning in CMOS semiconductor manufacturing", Jan.-Mar. 1995, IBM Journal of Research and Development, vol. 39 No. 1-2, p. 201-13.

Leonovich, G., " An approach for optimizing WIP/cycle time/output in a semiconductor fabricator", 1994, Sixteenth IEEE/CPMT International Electronics Manufacturing Technology Symposium. 'Low-Cost Manufacturing Technologies for Tomorrow's Global Economy'. Proceedings 1994 IEMT Symposium, vol. 1, p. 108-11.

Schomig, A. K. et al., "Performance modelling of pull manufacturing systems with batch servers", 1995, Proceedings 1995 INRIA/IEEE Symposium on Emerging Technologies and Factory Automation. ETFA '95, vol. 3, p. 175-83.

Fuller, L. F. et al., "Improving manufacturing performance at the Rochester Institute of Technology integrated circuit factory", 1995, IEEE/SEMI 1995 Advanced Semiconductor Manufacturing Conference and Workshop. Theme—Semiconductor Manufacturing: Economic Solutions for the 21st Century. ASMC '95 Proceedings, p. 350-5.

Collins, D. W. et al., "Implementation of Minimum Inventory Variability Scheduling 1-Step Ahead Policy(R) in a large semiconductor manufacturing facility", 1997, 1997 IEEE 6th International Conference on Emerging Technologies and Factory Automation Proceedings, pp. 497-504.

Labanowski, L., " Improving overall fabricator performance using the continuous improvement methodology", 1997, 1997 IEEE/SEMI Advanced Semiconductor Manufacturing Conference and Workshop. Theme—The Quest for Semiconductor Manufacturing Excellence: Leading the Charge into the 21st Century. ASMC Proceedings, p. 405-9.

Rose, O., " WIP evolution of a semiconductor factory after a bottleneck workcenter breakdown", 1998, 1998 Winter Simulation Conference. Proceedings, vol. 2, pp. 997-1003.

Dudde, R. et al., "Flexible data registration and automation in semiconductor production", 1997, Proceedings of the SPIE—The International Society for Optical Engineering, p. 171-81.

Padillo, J. M. et al., "A strategic domain:1E in the semiconductor industry", Mar. 1998, IIE Solutions, pp. 36-40, 42.

Collins, D. W. et al., "Investigation of minimum inventory variability scheduling policies in a large semiconductor manufacturing facility", 1997, Proceedings of the 1997 American Control Conference, vol. 3, p. 1924-8.

Martin, D. P., " Total operational efficiency (TOE): the determination of two capacity and cycle time components and their relationship to productivity improvements in a semiconductor manufacturing line", 1999, 10th Annual IEEE/SEMI. Advanced Semiconductor Manufacturing Conference and Workshop. ASMC 99 Proceedings, pp. 37-41.

Martin, D. P., "Capacity and cycle time-throughput understanding system (CAC-TUS) an analysis tool to determine the components of capacity and cycle time in a semiconductor manufacturing line", 1999, 10th Annual IEEE/SEMI. Advanced Semiconductor Manufacturing Conference and Workshop. ASMC 99 Proceedings, p. 127-31.

Marcoux, P. et al., "Determining capacity loss from operational and technical deployment practices in a semiconductor manufacturing line", 1999, 1999 IEEE International Symposium on Semiconductor Manufacturing Conference Proceedings, p. 3-5.

Chen, J. C. et al., " Capacity planning for a twin fab", 1999, 1999 IEEE International Symposium on Semiconductor Manufacturing Conference Proceedings, p. 317-20.

Hughlett, E., " Incremental levels of automation in the compound semiconductor fab", Aug. 2001, Compound Semiconductor, vol. 7 No. 7, p. 69-73.

Sarin, S. C. et al., "Reduction of average cycle time at a wafer fabrication facility", 2001, 2001 GaAs MANTECH Conference. Digest of Papers, p. 241-6.

Saito, K. et al., "A simulation study on periodical priority dispatching of WIP for product-mix fabrication", 2002, 13th Annual IEEE/SEMI Advanced Semiconductor Manufacturing Conference. Advancing the Science and Technology of Semiconductor Manufacturing. ASMC 2002, p. 33-7.

Wang, J. et al., "The improvement of automated material handling system traffic control", 2002, 2002 Semiconductor Manufacturing Technology Workshop, p. 271-4.

Wei Jie Lee, "Optimize WIP scale through simulation approach with WIP, turn-over rate and cycle time regression analysis in semiconductor fabrication", 2002, 2002 Semiconductor Manufacturing Technology Workshop, p. 299-301.

Young Hoon Lee et al., "Push-pull production planning of the re-entrant process", 2003, International Journal of Advanced Manufacturing Technology, vol. 22 No. 11-12, p. 922-31.

Garlid, Scott C., "From philosophy to reality. Interpreting the rules of JIT for IC manufacturing", 1989, SME Technical Paper (Series) MS. Publ by SME, p. 797.

Anon, " Wafer level automation", Jan. 1995, European Semiconductor, vol. 17 No. 1, p. 2.

Anon, "Coming of fab-wide automation", May 1998, European Semiconductor Design Production Assembly, vol. 20 No. 5, p. 21-22.

Pierce, Neal G. et al., "Dynamic dispatch and graphical monitoring system", 1999, IEEE International Symposium on Semiconductor Manufacturing Conference, Proceedings 1999, p. 65-68.

Nagesh, Sukhi et al., " Intelligent second-generation MES solutions for 300mm fabs", 2000, Solid State Technology, vol. 43 No. 6, pp. 133-134, 136, 138.

"300mm single-wafer transport", Jul. 1999, Solid State Technology—semiconductor manufacturing and wafer fabrication, Semicon West '99 Product Spotlight, p. 5.

"300mm single-wafer handling", Apr. 2000, Solild State Technology, Product News, <www.sold-state.com>, p. 99.

Griessing, Juergen et al., "Assessing the feasibility of a 300-mm test and monitor wafer handeling and logistics system", Jul. 2000, Micro: The 300-mm Imperative, pp. 1-19.

"The Leading Company in Micro environment", Jan. 3, 2002, Incam Solutions Company, pp. 1-2.

"Improved wafer isolation and additional flexibility", Jan. 3, 2002, Incam Solutions Company SWIF technology, pp. 1-2.

"SEMI standards compliance" and "Related SEMI standards", Jan. 3, 2002, Incam Solutions Related standards, p. 1.

"Single Wafer Lots Solution", Jan. 3, 2002, Incam Solutions References, p. 1.

Przewlocki, H. et al., "DIASTEMOS-computerized system of IC manufacturing control and diagnostics", 1990, Elektronika, vol. 31 No. 11-12, pp. 38-40, Polish Language. (Abstract only).

Juba, R. C. et al., "Production improvements using a forward scheduler", 1996, Seventeenth IEEE/CPMT International Electronics Manufacturing Technology Symposium 'Manufacturing Technologies—Present and Future', p. 205-9.

Houmin, Yan et al., "Testing the robustness of two-boundary control policies in semiconductor manufacturing", May 1996, IEEE Transactions on Semiconductor Manufacturing, vol. 9 No. 2, p. 285-8.

Lopez, M. J. et al., "Performance models of systems of multiple cluster tools", 1996, Nineteenth IEEE/CPMT International Electronics Manufacturing Technology Symposium. Proceedings 1996 IEMT Symposium, pp. 57-65.

Iriuchijima, K. et al., "WIP allocation planning for semiconductor factories", 1998, Proceedings of the 37th IEEE Conference on Decision and Control, vol. 3, p. 2716-21.

Weiss, M., "New twists on 300mm fab design and layout", Jul. 1999, Semiconductor International, vol. 22 No. 8, pp. 103-104, 106,108.

Van Antwerp, K. et al., "Improving work-in-progress visibility with active product tags YASIC manufacture", Oct. 1999, Micro, vol. 17 No. 9, pp. 67-69, 72-73.

Wei Jun-Hu et al., "Optimization methodology in simulation-based scheduling for semiconductor manufacturing", Oct. 2000, Information and Control, vol. 29 No. 5, p. 425-30, Chinese language. (Abstract only).

* cited by examiner

SYSTEMS AND METHODS FOR TRANSFERRING SMALL LOT SIZE SUBSTRATE CARRIERS BETWEEN PROCESSING TOOLS

This application claims priority from U.S. provisional application Ser. No. 60/443,001, filed Jan. 27, 2003, the content of which is hereby incorporated by reference herein in its entirety.

FIELD OF THE INVENTION

The present invention relates generally to semiconductor device fabrication systems, and more particularly to the transportation of substrate carriers within a fabrication facility.

CROSS REFERENCE TO RELATED APPLICATIONS

The present application is related to the following commonly-assigned, co-pending U.S. Patent Applications, each of which is hereby incorporated by reference herein in its entirety:

U.S. patent application Ser. No. 10/650,310, filed Aug. 28, 2003 and titled "System For Transporting Substrate Carriers";

U.S. patent application Ser. No. 10/650,312, filed Aug. 28, 2003 and titled "Method and Apparatus for Using Substrate Carrier Movement to Actuate Substrate Carrier Door Opening/Closing";

U.S. patent application Ser. No. 10/650,481, filed Aug. 28, 2003 and titled "Method and Apparatus for Unloading Substrate Carriers from Substrate Carrier Transport Systems";

U.S. patent application Ser. No. 10/650,479, filed Aug. 28, 2003 and titled "Method and Apparatus for Supplying Substrates to a Processing Tool";

U.S. patent application Ser. No. 60/407,452, filed Aug. 31, 2002 and titled "End Effector Having Mechanism For Reorienting A Wafer Carrier Between Vertical And Horizontal Orientations";

U.S. patent application Ser. No. 60/407,337, filed Aug. 31, 2002, and titled "Wafer Loading Station with Docking Grippers at Docking Stations";

U.S. patent application Ser. No. 10/650,311, filed Aug. 28, 2003 and titled "Substrate Carrier Door having Door Latching and Substrate Clamping Mechanism";

U.S. patent application Ser. No. 10/650,480, filed Aug. 28, 2003 and titled "Substrate Carrier Handler That Unloads Substrate Carriers Directly From a Moving Conveyor";

U.S. Provisional Application Ser. No. 60/443,087, filed Jan. 27, 2003 and titled "Methods and Apparatus for Transporting Wafer Carriers";

U.S. Provisional Application Ser. No. 60/443,153, filed Jan. 27, 2003, and titled "Overhead Transfer Flange and Support for Suspending Wafer Carrier";

U.S. Provisional Application Ser. No. 60/443,115, filed Jan. 27, 2003, and titled "Apparatus and Method for Storing and Loading Wafer Carriers";

U.S. Provisional Patent Application Ser. No. 60/520,180, filed Nov. 13, 2003, and titled "Calibration of High Speed Loader to Substrate Transport System"; and U.S. Provisional Patent Application Ser. No. 60/520,035, filed Nov. 13, 2003, and titled "Apparatus and Method for Transporting Substrate Carriers Between Conveyors".

BACKGROUND OF THE INVENTION

Manufacturing of semiconductor devices typically involves performing a sequence of procedures with respect to a substrate such as a silicon substrate, a glass plate, etc. These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing location to another. Depending on the type of semiconductor device to be manufactured, there may be a relatively large number of processing steps required, to be performed at many different processing locations within the fabrication facility.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

For an individual substrate, the total fabrication process, from formation or receipt of the virgin substrate to cutting of semiconductor devices from the finished substrate, may require an elapsed time that is measured in weeks or months. In a typical fabrication facility, a large number of substrates may accordingly be present at any given time as "work in progress" (WIP). The substrates present in the fabrication facility as WIP may represent a very large investment of working capital, which tends to increase the per substrate manufacturing cost.

When a fabrication facility is fully operational, reducing WIP decreases capital and manufacturing costs. WIP reduction may be achieved, for example, by reducing the average total elapsed time for processing each substrate within the fabrication facility.

Previously incorporated U.S. patent application Ser. No. 10/650,310, filed Aug. 28, 2003, titled "System for Transporting Semiconductor Substrate Carriers", discloses a substrate carrier transport system that includes a conveyor for substrate carriers that is intended to be constantly in motion during operation of the fabrication facility which it serves. The constantly moving conveyor is intended to facilitate transportation of substrates within the fabrication facility so as to reduce the total "dwell" or "cycle" time of each substrate in the fabrication facility. WIP reduction thereby may be achieved as less WIP is needed to produce the same factory output.

SUMMARY OF THE INVENTION

In a first aspect of the invention, a first method of managing work in progress within a small lot size semiconductor device manufacturing facility is provided. The first method includes providing a small lot size semiconductor device manufacturing facility having (1) a plurality of processing tools; and (2) a high speed transport system adapted to transport small lot size substrate carriers among the processing tools. The first method further includes maintaining a predetermined work in progress level within the small lot size semiconductor device manufacturing facility by (1) increasing an average cycle time of low priority substrates within the small lot size semiconductor device manufacturing facility; and (2) decreasing an average cycle time of high priority substrates within the small lot size semiconductor device manufacturing facility so as to approximately maintain the predetermined work in progress level within the small lot size semiconductor device manufacturing facility.

In a second aspect of the invention, a second method of managing work in progress within a small lot size semiconductor device manufacturing facility is provided. The second method includes providing a small lot size semiconductor device manufacturing facility having (1) a plurality of processing tools; (2) small lot size substrate carrier storage locations proximate each of the processing tools; and (3) a high speed transport system adapted to transport small lot size substrate carriers among the processing tools. The second method further includes (1) storing small lot size substrate carriers containing low priority substrates within the small lot size substrate carrier storage locations of one or more of the processing tools; and (2) processing high priority substrates available to the one or more of the processing tools ahead of the stored low priority substrates so as to reduce cycle time of high priority substrates without correspondingly reducing work in progress within the small lot size semiconductor device manufacturing facility.

In a third aspect of the invention, a third method of managing work in progress within a small lot size semiconductor device manufacturing facility is provided. The third method includes providing a small lot size semiconductor device manufacturing facility having (1) a plurality of processing tools; (2) small lot size substrate carrier storage locations proximate each of the processing tools; and (3) a high speed transport system adapted to transport small lot size substrate carriers among the processing tools. The third method also includes (1) storing small lot size substrate carriers containing low priority substrates and small lot size substrate carriers containing high priority substrates within the small lot size substrate carrier storage locations of one or more of the processing tools; and (2) prior to processing within the one or more of the processing tools, storing high priority substrates for a shorter time period on average than low priority substrates so as to reduce cycle time of high priority substrates without correspondingly reducing work in progress within the small lot size semiconductor device manufacturing facility.

In a fourth aspect of the invention, a fourth method of managing work in progress within a small lot size semiconductor device manufacturing facility is provided. The fourth method includes providing a small lot size semiconductor device manufacturing facility having (1) a plurality of processing tools; and (2) a high speed transport system adapted to transport small lot size substrate carriers among the processing tools. The fourth method also includes processing high and low priority substrates within the small lot size semiconductor device manufacturing facility with different cycle times while keeping average cycle time and work in progress at approximately the same level as average cycle time and work in progress of a large lot size semiconductor device manufacturing facility.

In a fifth aspect of the invention, a fifth method of managing work in progress within a small lot size semiconductor device manufacturing facility is provided. The fifth method includes providing a small lot size semiconductor device manufacturing facility having (1) a plurality of processing tools; and (2) a high speed transport system adapted to transport small lot size substrate carriers among the processing tools. The fifth method further includes processing substrates within the small lot size semiconductor device manufacturing facility with a lower average cycle time than a large lot size semiconductor device manufacturing facility while maintaining approximately the same overall output as the large lot size semiconductor device manufacturing facility.

In a sixth aspect of the invention, a sixth method of managing work in progress within a small lot size semiconductor device manufacturing facility is provided. The sixth method includes providing a small lot size semiconductor device manufacturing facility having (1) a plurality of processing tools; and (2) a high speed transport system adapted to transport small lot size substrate carriers among the processing tools. The sixth method also includes processing substrates within the small lot size semiconductor device manufacturing facility with approximately the same average cycle time and work in progress as a large lot size semiconductor device manufacturing facility while increasing output of the small lot size semiconductor device manufacturing facility relative to the large lot size semiconductor device manufacturing facility.

In a seventh aspect of the invention, a seventh method of managing work in progress within a small lot size semiconductor device manufacturing facility is provided. The seventh method includes providing a small lot size semiconductor device manufacturing facility having (1) a plurality of processing tools; and (2) a high speed transport system adapted to transport small lot size substrate carriers among the processing tools. The seventh method also includes (1) identifying work in progress that is not to be processed within a predetermined time period; (2) transferring the identified work in progress from small lot size substrate carriers to large lot size substrate carriers; and (3) storing the large lot size substrate carriers in volume storage. Numerous other aspects are provided, as are systems and apparatus in accordance with these and other aspects of the invention.

Other features and aspects of the present invention will become more fully apparent from the following detailed description, the appended claims and the accompanying drawings.

DETAILED DESCRIPTION

Figure 1:
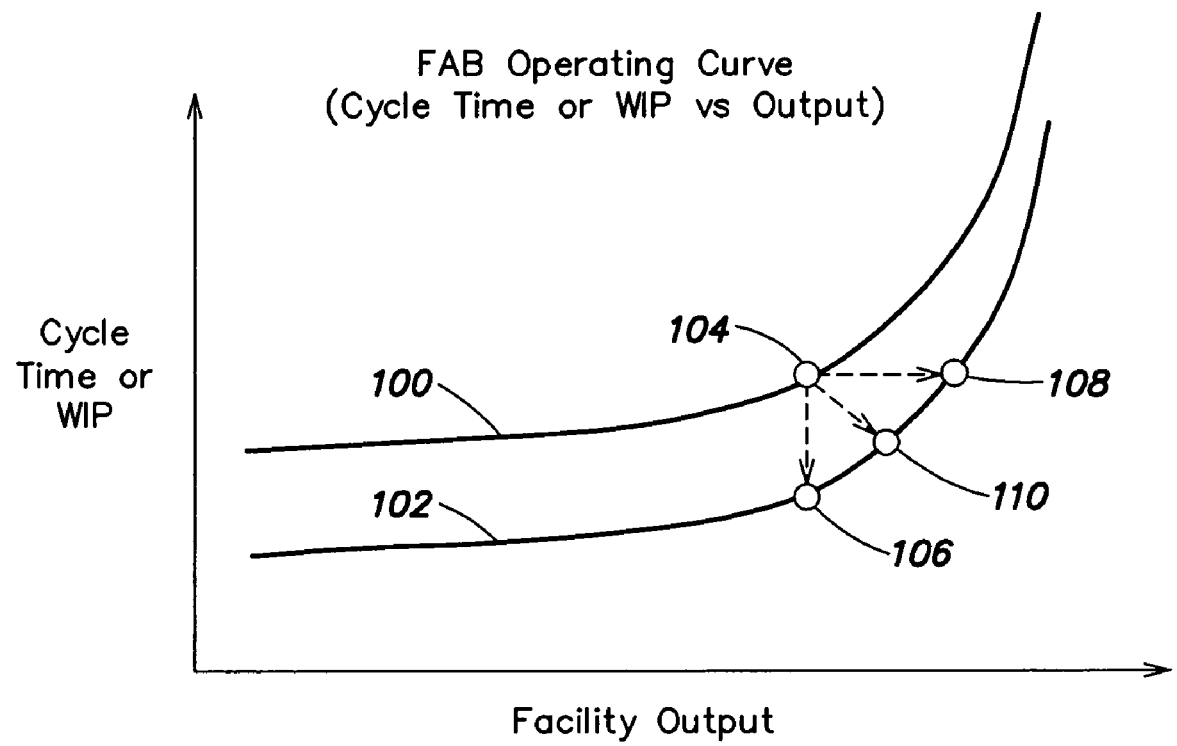
FIG. 1 is an exemplary graph of semiconductor device fabrication facility (FAB) cycle time or WIP versus facility output for large and small lot size substrate carriers.

As stated, for a fully operational fabrication facility, reducing WIP decreases capital and manufacturing costs. However, reduced WIP also may place a semiconductor device manufacturing facility as risk. For instance, when a processing tool within a fabrication line becomes non-operational (e.g., "goes down" due to equipment failure, for periodic maintenance or cleaning, etc.), WIP may provide sufficient substrate buffering to allow continued factory output until the non-operational tool becomes operational (e.g., is brought "back on line"). Insufficient WIP, on the other hand, may cause the manufacturing line to sit idle.

In general, when average cycle time per substrate is reduced within a semiconductor device manufacturing facility, a corresponding reduction (e.g., a similar, proportional or otherwise-related reduction) in work in progress is realized as, on average, more substrates may be moved through the facility. In accordance with at least one embodiment of the present invention, average cycle time per substrate may be maintained approximately constant by increasing the cycle time of low priority substrates while decreasing the cycle time of high priority substrates. (Note that low and high priority substrates may be distributed over a range of priority values, such as from priority 1 to priority 100 or over some other suitable priority range). In this manner, the relationship between the cycle time of high priority substrates and work in progress may be decoupled (e.g., reduced or eliminated) such that a decrease in high priority substrate cycle time does not produce a corresponding decrease in work in progress within a semiconductor device fabrication facility employing the present invention.

To reduce average cycle time in accordance with the present invention, "small lot" size substrate carriers are employed with a high speed substrate carrier transport system. The high speed substrate carrier transport system may transport substrate carriers within a semiconductor device fabrication facility at a significantly higher speed than conventional transport systems (as described below). Accordingly, any given substrate carrier may be routed through the facility faster.

As used herein, a "small lot" size substrate carrier refers to a substrate carrier that is adapted to hold significantly fewer substrates than a conventional "large lot" size substrate carrier which typically holds 13 or 25 substrates. As an example, in one embodiment, a small lot size substrate carrier is adapted to hold 5 or less substrates. Other small lot size carriers may be employed (e.g., small lot size carriers that hold 1, 2, 3, 4 or more than five substrates, but significantly less than that of a large lot size substrate carrier). In general, each small lot size substrate carrier may hold too few substrates for human transport of substrates carriers to be viable within a semiconductor device manufacturing facility.

Use of Small Lot Sizes During Semiconductor Device Manufacturing

FIG. 1 is an exemplary graph of semiconductor device fabrication facility (FAB) cycle time or WIP versus facility output for large and small lot size substrate carriers. With reference to FIG. 1, curve 100 illustrates cycle time or WIP versus facility output for a typical semiconductor device fabrication facility configured to transport large lot size substrate carriers. Curve 102 illustrates cycle time or WIP versus facility output for a semiconductor device fabrication facility configured to transport small lot size substrate carriers in accordance with the present invention.

Curve 100 illustrates how facility output increases with WIP. As WIP continues to increase, facility output also increases. Eventually large WIP increases are required for relatively small output gains. Accordingly, to provide facility output predictability, large lot size facilities typically operate near the knee of curve 100 (as represented by reference numeral 104). At such a location, facility output is near its maximum and small increases or decreases in cycle time or WIP have little effect on facility output.

Curve 102 illustrates how use of small lot size substrate carriers with a high speed substrate carrier transport system (described below) can affect WIP and/or facility output. For example, as shown in FIG. 1, curve 102 is shifted to the right and down relative to curve 100. Such a shift indicates that the same level of facility output can be maintained with less WIP (as indicated by reference numeral 106). Alternatively, if the same level of WIP is desired within the small lot size facility as is present in the large lot size facility governed by curve 100, output within the small lot size facility may be increased (as in indicated by reference numeral 108). In at least one embodiment of the invention, factory output is increased through a slight reduction in WIP, as shown, for example, by reference numeral 110. Other operating points along the curve 102 also may be employed.

Selection of the "optimal" operating point on the curve 102 depends on numerous factors. For example, some products have long product life cycles and relatively stable prices (e.g., devices for embedded applications such as devices used within industrial equipment or other long-product-life applications). Devices used in these products can be fabricated and stored in inventory for sale at later dates with little financial risk. Substrates for such devices may be classified as low priority and used to fill capacity of the fabrication facility. As inventories become depleted, the priority for these substrates may be increased as required to meet committed business arrangements (e.g., lead time, stocking levels, etc.).

Substrates for devices used in mature, commodity products, such as DRAM products that have been on the market for 3–4 years, also are candidates for low priority substrates. Yields for these devices are generally high, and the commodity nature of the product employing the devices ensures that a market exists. Accordingly, inventory obsolescence is unlikely, but profit potential is relatively low. However, such substrates may provide capacity fill in to ensure that equipment is continually utilized to build revenue generating product.

New products characteristically provide high gross margins. Substrates for devices used in such products may be given a high priority. In this manner, the fabrication facility may increase profit per substrate by biasing production to higher gross margin products. New products often experience rapid selling erosion due to competition and marketing strategies that push lower pricing to expand market penetration. Placing higher priority on these products and selectively reducing the manufacturing cycle time may increase the product volume that can be sold at higher gross margin. Substrates for devices used in products with a short-life cycle also may be given a high priority. Short life cycle products may include, for example, customized devices for consumer electronics such as specialized memory devices for digital cameras, video game controllers, cell phone components, etc. More risk exists in creating an inventory of these type of devices as prices may drop rapidly as they approach obsolescence.

Special order devices or devices under development, undergoing changes or undergoing special quality tests, are often handled specially in fabrication facilities; and substrates used for the fabrication of such devices are often referred to as "hot lots" or "super hot lots". Hot lots are often prioritized to be moved to the front of a queue for each process step. Super hot lots may be given higher priority and equipment may be reserved, or kept idle, waiting for the super hot lot substrates to arrive. In a conventional fabrication facility that employs 13 or 25 substrates per lot, the use of hot lots and super hot lots may cause significant disruptions in process flow. However, as described further below, in a small lot size fabrication facility provided in accordance with the present invention, special order and other similar devices may be interlaced into the existing production flow with little loss of tool utilization. Substrates used for the fabrication of such devices may be given the highest priority within the fabrication facility.

Exemplary Small Lot Size Semiconductor Device Manufacturing Facility

Figure 2:
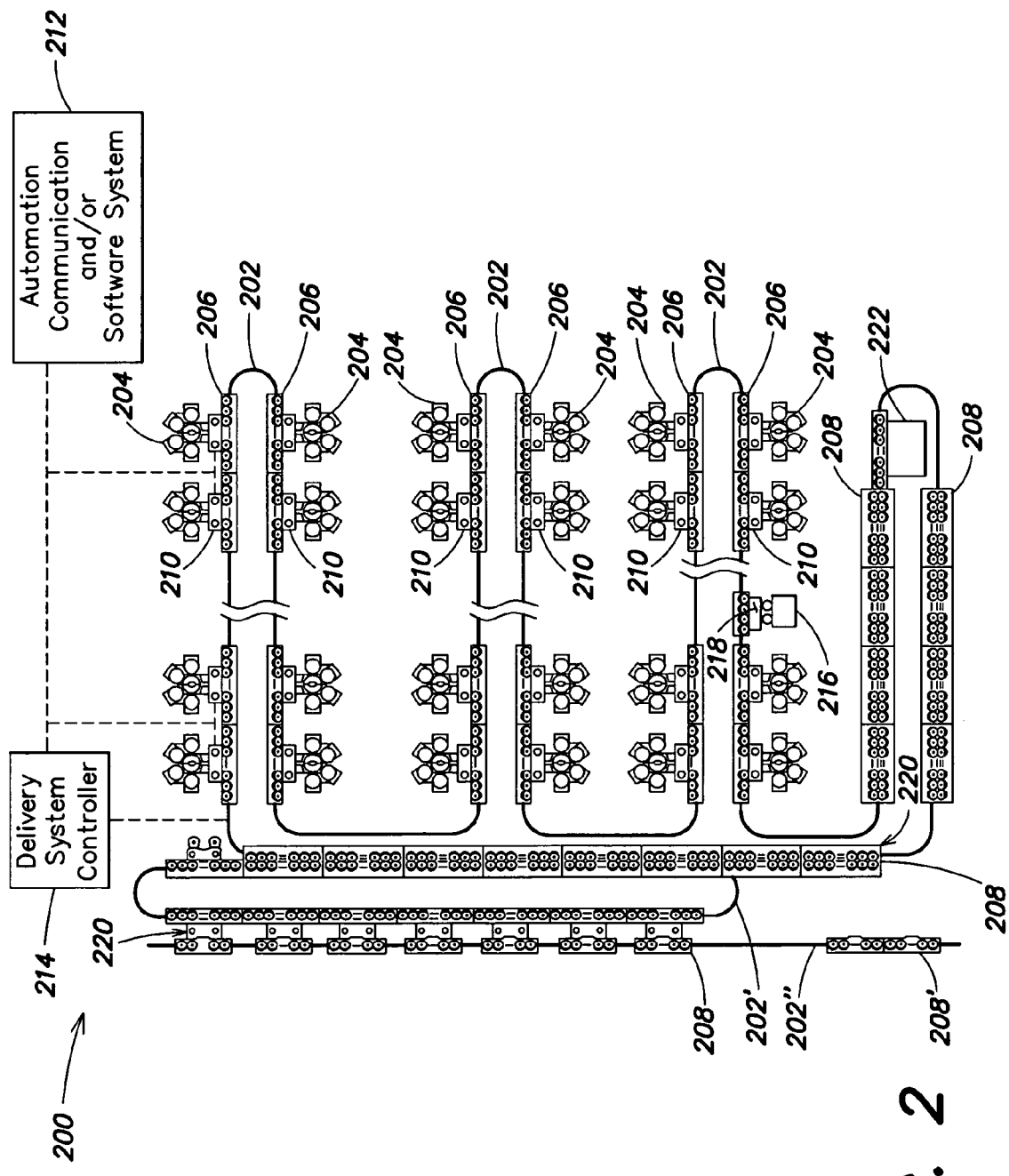
FIG. 2 is a schematic diagram of an exemplary small lot size (SLS) semiconductor device manufacturing facility provided in accordance with the present invention.

FIG. 2 is a schematic diagram of an exemplary small lot size (SLS) semiconductor device manufacturing facility 200 provided in accordance with the present invention. With reference to FIG. 2, the SLS facility 200 includes a high speed substrate carrier transport system 202 adapted to deliver small lot size substrate carriers to a plurality of processing tools 204. Local storage or buffering 206 is provided at or near each processing tool 204 for local storage of WIP. Additional, volume storage or buffering 208 also may be provided (e.g., volume stocking for accommodating peaks in WIP that develop during manufacturing and for longer term storage of WIP).

Carrier opening devices 210 are provided at each processing tool 204 for opening small lot size substrate carriers so that substrates contained therein may be extracted therefrom, processed and/or returned thereto. Mechanisms (not separately shown) are provided for transferring small lot size substrate carriers from the high speed transport system 202 to the carrier opening devices 210 of each processing tool 204 as described further below.

An automation communications and/or software system 212 is provided for controlling operation of the fabrication facility 200, and may include, for example, a manufacturing execution system (MES), a Material Control System (MCS), a Scheduler or the like. A separate delivery system controller 214 for controlling delivery of small lot size substrate carriers to the processing tools 204 is shown in FIG. 2. It will be appreciated that the delivery system controller 214 may be part of the automation communications and/or software system 212; and/or that a separate MES, MCS or Scheduler may be employed.

Most processing tools, even in a large lot size fabrication facility, process substrates in small batches (e.g., by processing one or two substrates per processing chamber at a time). However, some processing tools, such as furnaces or wet processing tools, process substrates in large batch sizes (e.g., from about 25 to 200 substrates per batch). Accordingly, the small lot size fabrication facility 200 may be adapted to accommodate the delivery, storage and operating requirements of large batch size processing tools. One such exemplary large batch size processing tool is indicated by reference numeral 216 in FIG. 2.

Many large batch size processing tools utilize an equipment front end module (EFEM), not separately shown, to remove substrates directly from a large lot size carrier with a robot blade (e.g., one substrate at a time). Individual substrates then are transferred by the processing tool to a process chamber as required to build the necessary large batch for processing. By providing local storage of small lot size substrate carriers at such a processing tool, a large substrate batch may be built using an equipment front end module of a large batch size processing tool within the small lot size fabrication facility 200.

Other large batch size processing tools pull complete large lot size carriers into an internal buffer, or simultaneously pull multiple substrates from a large lot size substrate carrier into a internal buffer. For such tools, a sorter module 218 that moves substrates from small lot size carriers to large lot size carriers may be employed within the small lot size fabrication facility 200.

As stated, the high speed transport system 202 is adapted to deliver small lot size substrate carriers to the plurality of processing tools 204. Such a system preferably has a move rate capacity of at least 2 times the average rate required for normal production capacity (e.g., to be able to respond to peaks in move rate requirements that occur during normal production). Additionally, the system preferably has the ability to re-direct, re-route or re-move substrates to different processing tools in response to factory anomalies, excursions and/or manufacturing processing changes (e.g., un-scheduled maintenance, priority changes, manufacturing yield problems, etc.).

U.S. patent application Ser. No. 10/650,310, filed Aug. 28, 2003 (the '310 Application), discloses a substrate carrier transport system (e.g., a conveyor) that may be used as the small lot size substrate carrier transport system 202. The transport system of the '310 Application continues to move during substrate carrier unloading and loading operations. A load/unload mechanism may be associated with each processing tool or group of processing tools and operate to load and/or unload substrate carriers from or onto the transport system while the transport system is moving. Each load/unload mechanism may include a load/unload member that is moved during a load or unload operation so as to substantially match the velocity at which the transport system carries substrate carriers. The load and/or unload member is thus adapted to ensure gentle substrate/substrate carrier handling. The transport system of the 310' Application may be operated at significantly higher speeds than conventional large lot size transport systems; and can easily accommodate re-directing, re-routing and/or re-moving of substrates to different processing tools in response to factory anomalies, excursions and/or manufacturing processing changes. Other substrate carrier transport systems may be similarly employed.

One particular embodiment of a suitable high speed transport system is described in U.S. patent application Ser. No. 60/443,087, filed Jan. 27, 2003 (the '087 Application). The '087 Application describes a conveyor system that may include a ribbon of stainless steel or a similar material that forms a closed loop within at least a portion of a semiconductor device manufacturing facility and that transports substrate carriers therein. By orienting the ribbon so that a thick portion of the ribbon resides within a vertical plane and a thin portion of the ribbon resides within a horizontal plane, the ribbon is flexible in the horizontal plane and rigid in the vertical plane. Such a configuration allows the inventive conveyor to be constructed and implemented inexpensively. For example, the ribbon requires little material to construct, is easy to fabricate and, due to its vertical rigidity/strength, can support the weight of numerous substrate carriers without supplemental support structure (such as rollers or other similar mechanisms used in conventional, horizontally-oriented belt-type conveyor systems). Furthermore, the conveyor system is highly customizable because the ribbon may be bent, bowed or otherwise shaped into numerous configurations due to its lateral flexibility.

As shown in FIG. 2, the SLS fabrication facility 200 may include additional high speed transport systems as indicated by reference numerals 202' and 202". Few or more than three such transport systems may be employed. Additional high speed transport systems may be employed, for example, to transfer small lot size substrate carriers to other portion of a fabrication facility, such as to equipment that processes substrates stored in large lot size substrate carriers, different physical areas of the fabrication facility (such as an expanded area of the facility), etc. One or more transfer mechanisms 220 may be employed to transfer substrate carriers between the high speed transport systems 202, 202', and 202" and/or to provide additional substrate carrier storage. In at least on embodiment of the invention, one or more substrate carrier handlers and a rotary substrate carrier stage may be employed to remove a substrate carrier from a first high speed transport system (e.g., high speed transport system 202 in FIG. 2) and transfer the substrate carrier to a second high speed transport system (e.g., high speed transport system 202' in FIG. 2) or vice versa. Such a system and method is described in U.S. Provisional Patent Application Ser. No. 60/520,035, filed Nov. 13, 2003.

To avoid depletion of substrate carriers from the high speed transport system 202, each processing tool 204 may include local storage for buffering or storing WIP (as stated). Stand-alone operation of a processing tool without needing the high speed transport system 202 to deliver substrates to the tool thereby may be provided. Because many conventional processing tools accommodate at least two large lot size (e.g., 25) substrate carriers, in at least one embodiment of the invention, local storage at or near each processing tool 204 is adapted to store a similar number of substrates by storing numerous small lot size substrate carriers at or near each processing tool (e.g., about 50 or more small lot size carriers in one embodiment). Other or different numbers of substrate carriers also may be stored at or near each processing tool 204 (e.g., fewer than 50, more than 50, etc.).

U.S. Provisional Application Ser. No. 60/443,115, filed Jan. 27, 2003, discloses a high-speed bay-distributed stocker (HSBDS) having a chassis which is notably longer in a direction of travel of a high speed transport system it serves, as compared to conventional bay-distributed stockers. The HSBDS features a high-speed substrate carrier handler adapted to load substrate carriers onto and unload substrate carriers from a high speed transport system. The HSBDS also includes additional columns of substrate carrier storage shelves for providing additional substrate buffering. Other systems for providing local storage may be employed (e.g., distributed stockers, field stockers, overhead/ceiling mounted tables or shelves, etc).

Volume storage or buffering 208 may provide volume stocking for accommodating peaks in WIP that develop during manufacturing and for longer term storage of WIP. For example, orders placed on hold, non-product substrates, and the like may be placed in volume storage or buffering. Selection of the capacity of such volume storage or buffering is driven by fabrication facility requirements. Volume storage or buffering 208 may include, for example, small lot size stockers along a high speed transport loop, large lot size stockers on the high speed transport path or along a slower transport path (not shown), another type of high density storage, distributed stockers, field stockers, overhead and/or ceiling mounted tables or shelves, etc. Substrates stored in small lot size substrate carriers may be transferred to large lot size carriers via a sorter, and subsequently placed in a high density storage location.

In at least one embodiment of the invention, work in progress that is low usage (e.g., inactive WIP such as substrates put on engineering hold, test substrates, non-production substrates, substrates built for long term hold, etc.) may be stored in large lot size substrate carriers that have greater storage capacity (as the cost of storing substrates within such high density carriers is generally cheaper than using small lot size carrier storage). For example, low use WIP may be transferred from small lot size carriers into large lot size carriers (e.g., via a sorter) and stored in volume stockers. If the low use WIP is not to be processed within a predetermined time period (e.g., 5 days or some other time period), the WIP may be transferred from small lot size carriers to large lot size carriers (e.g., carriers that store 13 or 25 substrates) and transferred to another location within the fabrication facility 200. For example, volume storage 208' may include large lot size volume stockers adapted to store low usage WIP at a location away from the main processing area of the fabrication facility 200.

During loading and unloading of substrate carriers at a processing tool 204, communication between the processing tool 204 and the fabrication facility 200 may provide lot identification information, processing parameters, tool operating parameters, processing instructions, or the like. The automation communications and/or software system 212 is designed to handle this and other communications. Preferably such communication is rapid enough so as not to delay substrate processing. For example, a typical requirement for loading of a substrate carrier at a factory interface of a processing tool may be less than about 200 seconds, and in some cases less than 30 seconds.

In at least one embodiment of the invention, the automation communication and/or software system 212 is adapted to perform substrate-level tracking (as opposed to carrier level tracking typically employed in a large lot size environment) and may reference substrates grouped as a lot if necessary. Such a substrate-based approach may increase performance of the fabrication facility 200 and may prevent software restrictions from negating the benefits of small lot size manufacturing.

The carrier opening devices 210 at each processing tool 204 (for opening small lot size substrate carriers so that substrates contained therein may be extracted therefrom, processed and/or returned thereto) preferably employ industry standard interfaces (e.g., SEMI standards) to minimize facility-wide implementation costs. Alternative carrier opening mechanisms may be employed. For example, U.S. patent application Ser. No. 10/650,311, filed Aug. 28, 2003, discloses a door latching mechanism of a substrate carrier that is automatically unlatched by interaction of the latching mechanism with an actuator mechanism at a substrate transfer location (e.g., of a processing tool that may be used, for example, during semiconductor device manufacturing). The same actuator mechanism also may release a substrate clamping mechanism that may be part of the substrate carrier (e.g., and that secures a substrate stored by the substrate carrier during transport). Likewise, U.S. patent application Ser. No. 10/650,312, filed Aug. 28, 2003, describes the use of movement of a substrate carrier toward a port of a substrate transfer location to cause the door of the substrate carrier to open. Movement of the substrate carrier away from the port of the substrate transfer location causes the door of the substrate carrier to close. Other carrier opening methods and apparatus may be employed.

Because of the relatively low move rates employed within large lot size fabrication facilities, human operators may move lots between processing tools when needed (e.g., when an automated transport system fails). For small lot size manufacturing, the required move rate is so large that use of human operators is typically impractical. As a result, redundant systems (other than human operators) may be employed to ensure proper facility operation. Such redundant systems may include, for example, additional control system computers, software databases, automated transport systems and the like (not separately shown).

In at least one embodiment of the invention, the small lot size fabrication facility 200 may include, for example, the ability to install and set up new processing tools while the high speed transport system 202 is operating (e.g., is in motion and/or servicing other tools). U.S. Provisional Patent Application Ser. No. 60/520,180, filed Nov. 13, 2003, describes methods by which a high speed substrate carrier transfer station (for loading substrate carriers onto and for removing substrate carriers from a high speed substrate carrier transport system) may be aligned and calibrated to a high speed substrate carrier transport system while the transport system is in motion. The substrate carrier hand-off function of the transfer station may then be tested, and the high-speed transfer station placed into service. Other methods/systems also may be employed.

Use of a small lot size fabrication facility such as that described above with reference to FIG. 2 provides numerous advantages over conventional large lot size fabrication facilities. For example, a small lot size fabrication facility may provide greater versatility. As described with reference to FIG. 1, for an equivalent set of processing tools, a small lot size fabrication facility may be operated at (1) equivalent output with reduced cycle time; (2) equivalent cycle time with increase factory output; or (2) at some point therebetween. The facility operating conditions (versus a large lot size baseline) may be tuned based on business needs or other conditions to place priority on either cycle time reduction or increased capacity. Further, through use of the high speeds substrate carrier transport system, special order and other similar devices may be interlaced into the existing production flow with little loss of tool utilization. Hot lots and/or super hot lots typically may be processed within the small lot size fabrication facility with less impact to fabrication facility output rate. Less excess capacity thereby may be required to process hot lots and/or super hot lots.

The foregoing description discloses only exemplary embodiments of the invention. Modifications of the above disclosed apparatus and method which fall within the scope of the invention will be readily apparent to those of ordinary skill in the art. For instance, other configurations for a small lot size fabrication facility may be employed such as different processing tool, storage device and/or transport system layouts and/or types, more or fewer processing tools, storage devices and/or transport systems, etc. In at least one embodiment, a substrate carrier cleaner 222 may be provided for cleaning small lot size substrate carriers. In this manner substrate carriers may be cleaned so as to prevent cross-contamination of incompatible processes. A small lot size semiconductor device manufacturing facility such as that shown in FIG. 2 may form a part or subset of a larger semiconductor device manufacturing facility (e.g., that may include one or more other small lot size semiconductor device manufacturing facilities and/or one or more large lot size semiconductor device manufacturing facilities). For instance, a small lot size semiconductor device manufacturing facility may be employed to reduce the cycle time of all or a portion of an interconnect formation phase of device production. That is, a small lot size semiconductor device manufacturing facility provided in accordance with the invention may be employed to selectively accelerate a portion of device processing time. As another example, in a lithography bay, a small lot size fabrication module may be used to improve the cycle time for metrology, substrate reworks, etc.

The automation communication and/or software system 212, the delivery system controller 214 and/or any other controller may be programmed or otherwise configured to perform numerous WIP management functions. For instance, in at least one embodiment of the invention, such a system and/or controller may be configured to maintain a predetermined work in progress level within the small lot size semiconductor device manufacturing facility 200 by (1) increasing an average cycle time of low priority substrates within the small lot size semiconductor device manufacturing facility 200; and (2) decreasing an average cycle time of high priority substrates within the small lot size semiconductor device manufacturing facility 200 so as to approximately maintain a predetermined work in progress level within the small lot size semiconductor device manufacturing facility 200. In another embodiment of the invention, the system and/or controller may be configured to (1) store small lot size substrate carriers containing low priority substrates within small lot size substrate carrier storage locations of one or more of the processing tools 204; and (2) process high priority substrates available to the one or more of the processing tools 204 ahead of the stored low priority substrates so as to reduce cycle time of high priority substrates without correspondingly reducing work in progress within the small lot size semiconductor device manufacturing facility 200.

In yet another embodiment of the invention, such a system and/or controller may be configured to (1) store small lot size substrate carriers containing low priority substrates and small lot size substrate carriers containing high priority substrates within small lot size substrate carrier storage locations of one or more of the processing tools 204; and (2) prior to processing within the one or more of the processing tools 204, store high priority substrates for a shorter time period on average than low priority substrates so as to reduce cycle time of high priority substrates without correspondingly reducing work in progress within the small lot size semiconductor device manufacturing facility 200.

In a further embodiment of the invention, such a system and/or controller may be configured to process high and low priority substrates within the small lot size semiconductor device manufacturing facility 200 with different cycle times while keeping average cycle time and work in progress at approximately the same level as average cycle time and work in progress of a large lot size semiconductor device manufacturing facility.

In another embodiment of the invention, such a system and/or controller may be configured to process substrates within the small lot size semiconductor device manufacturing facility 200 with a lower average cycle time than a large lot size semiconductor device manufacturing facility while maintaining approximately the same overall output as the large lot size semiconductor device manufacturing facility.

In yet a further embodiment of the invention, such a system and/or controller may be configured to process substrates within the small lot size semiconductor device manufacturing facility 200 with approximately the same average cycle time and work in progress as a large lot size semiconductor device manufacturing facility while increasing output of the small lot size semiconductor device manufacturing facility 200 relative to the large lot size semiconductor device manufacturing facility.

In still a further embodiment of the invention, such a system and/or controller may be configured to (1) identified work in progress that is not to be processed within a predetermined time period; (2) transfer the identified work in progress from small lot size substrate carriers to large lot size substrate carriers; and store the large lot size substrate carriers in volume storage.

Accordingly, while the present invention has been disclosed in connection with exemplary embodiments thereof, it should be understood that other embodiments may fall within the spirit and scope of the invention, as defined by the following claims.

The invention claimed is:

1. A method of managing work in progress within a small lot size semiconductor device manufacturing facility comprising:
   providing a small lot size semiconductor device manufacturing facility having:
      a plurality of processing tools; and
      a high speed transport system adapted to transport small lot size substrate carriers among the processing tools, each small lot size substrate carrier adapted to transport fewer than a maximum of 13 substrates; and
   maintaining a predetermined work in progress level within the small lot size semiconductor device manufacturing facility by:
      increasing an average cycle time of low priority substrates within the small lot size semiconductor device manufacturing facility; and
      decreasing an average cycle time of high priority substrates within the small lot size semiconductor device manufacturing facility so as to approximately maintain the predetermined work in progress level within the small lot size semiconductor device manufacturing facility;
      wherein the high priority substrates each have a priority greater than a priority of any of the low priority substrates.

2. The method of claim 1 wherein the small lot size is 5 or fewer substrates.

3. The method of claim 2 wherein the small lot size is 3 or fewer substrates.

4. The method of claim 1 wherein increasing an average cycle time of low priority substrates and decreasing an average cycle time of high priority substrates comprises prior to processing, storing small lot size substrate carriers containing low priority substrates within the small lot size substrate carrier storage locations of one or more of the processing tools for a longer time period than small lot size substrate carriers containing high priority substrates.

5. A method of managing work in progress within a small lot size semiconductor device manufacturing facility comprising:
   providing a small lot size semiconductor device manufacturing facility having:
      a plurality of processing tools;
      small lot size substrate carrier storage locations proximate each of the processing tools; and
      a high speed transport system adapted to transport small lot size substrate carriers among the processing tools, each small lot size substrate carrier adapted to transport fewer than a maximum of 13 substrates;
   storing small lot size substrate carriers containing low priority substrates within the small lot size substrate carrier storage locations of one or more of the processing tools; and
   processing high priority substrates available to the one or more of the processing tools ahead of the stored low priority substrates so as to reduce cycle time of high priority substrates without correspondingly reducing work in progress within the small lot size semiconductor device manufacturing facility;
   wherein the high priority substrates each have a priority greater than a priority of any of the low priority substrates.

6. The method of claim 5 wherein the small lot size is 5 or fewer substrates.

7. The method of claim 6 wherein the small lot size is 3 or fewer substrates.

8. A method of managing work in progress within a small lot size semiconductor device manufacturing facility comprising:
   providing a small lot size semiconductor device manufacturing facility having:
      a plurality of processing tools;
      small lot size substrate carrier storage locations proximate each of the processing tools; and
      a high speed transport system adapted to transport small lot size substrate carriers among the processing tools, each small lot size substrate carrier adapted to transport fewer than a maximum of 13 substrates;
   storing small lot size substrate carriers containing low priority substrates and small lot size substrate carriers containing high priority substrates within the small lot size substrate carrier storage locations of one or more of the processing tools; and
   prior to processing within the one or more of the processing tools, storing high priority substrates for a shorter time period on average than low priority substrates so as to reduce cycle time of high priority substrates without correspondingly reducing work in progress within the small lot size semiconductor device manufacturing facility;
   wherein the high priority substrates each have a priority greater than a priority of any of the low priority substrates.

9. A method of managing work in progress within a small lot size semiconductor device manufacturing facility comprising:
   providing a small lot size semiconductor device manufacturing facility having:
      a plurality of processing tools; and
      a high speed transport system adapted to transport small lot size substrate carriers among the processing tools, each small lot size substrate carrier adapted to transport fewer than a maximum of 13 substrates; and
   processing high and low priority substrates within the small lot size semiconductor device manufacturing facility with different cycle times while keeping average cycle time and work in progress at approximately the same level as average cycle time and work in progress of a large lot size semiconductor device manufacturing facility;
   wherein the high priority substrates each have a priority greater than a priority of any of the low priority substrates; and
   wherein the large lot size semiconductor device manufacturing facility transports substrates in large lot size substrate carriers each adapted to transport 13 or more substrates.

10. A method of managing work in progress within a small lot size semiconductor device manufacturing facility comprising:
   providing a small lot size semiconductor device manufacturing facility having:
      a plurality of processing tools; and
      a high speed transport system adapted to transport small lot size substrate carriers among the processing tools, each small lot size substrate carrier adapted to transport fewer than a maximum of 13 substrates; and processing substrates within the small lot size semiconductor device manufacturing facility with a lower average cycle time than a large lot size semiconductor device manufacturing facility while maintaining approximately the same overall output as the large lot size semiconductor device manufacturing facility;

wherein the large lot size semiconductor device manufacturing facility transports substrates in large lot size substrate carriers each adapted to transport 13 or more substrates.

11. A method of managing work in progress within a small lot size semiconductor device manufacturing facility comprising:

providing a small lot size semiconductor device manufacturing facility having:
a plurality of processing tools; and
a high speed transport system adapted to transport small lot size substrate carriers among the processing tools, each small lot size substrate carrier adapted to transport fewer than a maximum of 13 substrates; and processing substrates within the small lot size semiconductor device manufacturing facility with approximately the same average cycle time and work in progress as a large lot size semiconductor device manufacturing facility while increasing output of the small lot size semiconductor device manufacturing facility relative to the large lot size semiconductor device manufacturing facility;

wherein the large lot size semiconductor device manufacturing facility transports substrates in large lot size substrate carriers each adapted to transport 13 or more substrates.

12. A method of managing work in progress within a small lot size semiconductor device manufacturing facility comprising:

providing a small lot size semiconductor device manufacturing facility having:
a plurality of processing tools; and
a high speed transport system adapted to transport small lot size substrate carriers among the processing tools, each small lot size substrate carrier adapted to transport fewer than a maximum of 13 substrates; and identifying work in progress that is not to be processed within a predetermined time period;

transferring the identified work in progress from small lot size substrate carriers to large lot size substrate carriers, each large lot size substrate carrier adapted to transport 13 or more substrates; and storing the large lot size substrate carriers in volume storage.

13. The method of claim 12 wherein transferring the identified work in progress from small lot size substrate carriers to large lot size substrate carriers comprises employing a sorter to transfer the identified work in progress from the small lot size substrate carriers to the large lot size substrate carriers.

14. The method of claim 12 wherein storing the large lot size substrate carriers in volume storage comprises storing the large lot size substrate carriers at a location remote from the processing tools.

15. The method of claim 14 further comprising storing small lot size substrate carriers proximate one or more of the processing tools.

16. The method of claim 12 further comprising retrieving a large lot size substrate carrier from volume storage and transferring substrates stored therein back into small lot size substrate carriers.

17. A small lot size semiconductor device manufacturing facility having:
a plurality of processing tools; and
a high speed transport system adapted to transport small lot size substrate carriers among the processing tools, each small lot size substrate carrier adapted to transport fewer than a maximum of 13 substrates; and
at least one controller adapted to:
maintain a predetermined work in progress level within the small lot size semiconductor device manufacturing facility by:
increasing an average cycle time of low priority substrates within the small lot size semiconductor device manufacturing facility; and
decreasing an average cycle time of high priority substrates within the small lot size semiconductor device manufacturing facility so as to approximately maintain the predetermined work in progress level within the small lot size semiconductor device manufacturing facility;
wherein the high priority substrates each have a priority greater than a priority of any of the low priority substrates.

18. A small lot size semiconductor device manufacturing facility having:
a plurality of processing tools;
small lot size substrate carrier storage locations proximate each of the processing tools;
a high speed transport system adapted to transport small lot size substrate carriers among the processing tools, each small lot size substrate carrier adapted to transport fewer than a maximum of 13 substrates; and
at least one controller adapted to:
store small lot size substrate carriers containing low priority substrates within the small lot size substrate carrier storage locations of one or more of the processing tools; and
process high priority substrates available to the one or more of the processing tools ahead of the stored low priority substrates so as to reduce cycle time of high priority substrates without correspondingly reducing work in progress within the small lot size semiconductor device manufacturing facility;
wherein the high priority substrates each have a priority greater than a priority of any of the low priority substrates.

19. A small lot size semiconductor device manufacturing facility having:
a plurality of processing tools;
small lot size substrate carrier storage locations proximate each of the processing tools;
a high speed transport system adapted to transport small lot size substrate carriers among the processing tools, each small lot size substrate carrier adapted to transport fewer than a maximum of 13 substrates; and
at least one controller adapted to:
store small lot size substrate carriers containing low priority substrates and small lot size substrate carriers containing high priority substrates within the small lot size substrate carrier storage locations of one or more of the processing tools; and
prior to processing within the one or more of the processing tools, store high priority substrates for a shorter time period on average than low priority substrates so as to reduce cycle time of high priority substrates without correspondingly reducing work in progress within the small lot size semiconductor device manufacturing facility;

wherein the high priority substrates each have a priority greater than a priority of any of the low priority substrates.

20. A small lot size semiconductor device manufacturing facility having:

a plurality of processing tools; and a high speed transport system adapted to transport small lot size substrate carriers among the processing tools, each small lot size substrate carrier adapted to transport fewer than a maximum of 13 substrates; and at least one controller adapted to process high and low priority substrates within the small lot size semiconductor device manufacturing facility with different cycle times while keeping average cycle time and work in progress at approximately the same level as average cycle time and work in progress of a large lot size semiconductor device manufacturing facility;

wherein the high priority substrates each have a priority greater than a priority of any of the low priority substrates; and wherein the large lot size semiconductor device manufacturing facility transports substrates in large lot size substrate carriers each adapted to transport 13 or more substrates.

21. A small lot size semiconductor device manufacturing facility having:

a plurality of processing tools; and a high speed transport system adapted to transport small lot size substrate carriers among the processing tools, each small lot size substrate carrier adapted to transport fewer than a maximum of 13 substrates; and at least one controller adapted to process substrates within the small lot size semiconductor device manufacturing facility with a lower average cycle time than a large lot size semiconductor device manufacturing facility while maintaining approximately the same overall output as the large lot size semiconductor device manufacturing facility;

wherein the large lot size semiconductor device manufacturing facility transports substrates in large lot size substrate carriers each adapted to transport 13 or more substrates.

22. A small lot size semiconductor device manufacturing facility having:

a plurality of processing tools; and a high speed transport system adapted to transport small lot size substrate carriers among the processing tools, each small lot size substrate carrier adapted to transport fewer than a maximum of 13 substrates; and at least one controller adapted to process substrates within the small lot size semiconductor device manufacturing facility with approximately the same average cycle time and work in progress as a large lot size semiconductor device manufacturing facility while increasing output of the small lot size semiconductor device manufacturing facility relative to the large lot size semiconductor device manufacturing facility;

wherein the large lot size semiconductor device manufacturing facility transports substrates in large lot size substrate carriers each adapted to transport 13 or more substrates.

23. A small lot size semiconductor device manufacturing facility having:

a plurality of processing tools; and a high speed transport system adapted to transport small lot size substrate carriers among the processing tools, each small lot size substrate carrier adapted to transport fewer than a maximum of 13 substrates; and at least one controller adapted to:

identify work in progress that is not to be processed within a predetermined time period;

transfer the identified work in progress from small lot size substrate carriers to large lot size substrate carriers, each large lot size substrate carrier adapted to transport 13 or more substrates; and store the large lot size substrate carriers in volume storage.

* * * * *